United States Patent [19]

Kanetake

[11] Patent Number: 5,446,623
[45] Date of Patent: Aug. 29, 1995

[54] SURFACE MOUNTING TYPE POLAR ELECTRONIC COMPONENT

[75] Inventor: Yasuo Kanetake, Kyoto, Japan

[73] Assignee: Rohm Co. Ltd., Japan

[21] Appl. No.: 294,017

[22] Filed: Aug. 23, 1994

[30] Foreign Application Priority Data

Aug. 24, 1993 [JP] Japan .................. 5-209238

[51] Int. Cl.$^6$ .................. H01R 9/00; H05K 7/02
[52] U.S. Cl. .................. 361/760; 257/692; 257/693; 257/696; 361/772; 361/773; 361/533
[58] Field of Search .................. 29/832, 834–835, 29/837–839, 842, 844–845; 437/203, 209, 906; 361/278, 299.2, 298.4, 303, 306.1, 307, 308.1, 520, 531, 533, 538, 760–764, 772–774, 777; 257/692–696

[56] References Cited

U.S. PATENT DOCUMENTS 4,945,398 7/1990 Kurita et al. .
4,951,124 8/1990 Sawaya .

FOREIGN PATENT DOCUMENTS 8633533.2 5/1987 Germany .................. H01G 1/14
363065 4/1988 Germany .................. H05K 1/18
330977 5/1991 Japan .

OTHER PUBLICATIONS

Japanese Patent Abstracts of Japan: 62-243347 A., E-599, Apr. 12, 1988, vol. 12, No. 115; 62-249464 A., E-601, Apr. 16, 1988, vol. 12, No. 124; 3-69106 A., E-1077, Jun. 14, 1991, vol. 15, No. 233; 3-200312 A., E-1137, Nov. 25, 1991, vol. 15, No. 464; 3-284818 A., E-1180, Mar. 19, 1992, vol. 16, No. 112.

Primary Examiner—Bot L. Ledynh
Attorney, Agent, or Firm—Michael D. Bednarek

[57] ABSTRACT

A surface mounting type polar electronic component is provided which comprises a polar element electrically connected to a positive lead and a negative lead, and a package enclosing the polar element together with part of the respective leads, the package having a mounting face. The leads have respective contact ends bent substantially in parallel to the mounting face of the package for contact with corresponding electrode pads of a circuit board. One of the leads has a projection extending beyond the contact end of said one lead for insertion into an insertion hole formed at a relevant one of the electrode pads.

10 Claims, 4 Drawing Sheets

SURFACE MOUNTING TYPE POLAR ELECTRONIC COMPONENT

BACKGROUND OF THE INVENTION

1. Field of the Invention

This invention relates to a polar electronic component of the type which comprises a pair of leads each extending out of a package and having a contact end bent substantially in parallel to the underside of the package for conveniently mounting to a circuit carrier by soldering.

Examples of such polar electronic components include a solid electrolytic capacitor and a diode.

2. Description of the Related Art

A solid electrolytic capacitor, which is a typical example of polar electronic component, is known from Japanese Patent Publication No. 3(1991)-30977 for example. The capacitor disclosed in this Japanese document has such a structure as shown in FIGS. 10 to 12.

Specifically, the prior art capacitor comprises a capacitor element 1 which includes a capacitor chip 1a and an anode wire 1b projecting from the chip 1a. The capacitor also includes an anode lead 2 in electrical connection with the anode wire 1b, and a cathode lead 3 in electrical connection to the chip 1a. The capacitor element together with part of the respective leads 2, 3 is enclosed in a resin package 4. The respective leads 2, 3 are bent toward and substantially in parallel to the underside 4a of the resin package 4 for conveniently mounting, by soldering, to a surface of a printed circuit board A' (see FIG. 12) which carries an anode-side electrode pad A1' and a cathode-side electrode pad A2'.

According to the prior art arrangement, the resin package 4 together with the projecting portions of the respective leads 2, 3 is symmetric with respect to a central plane transverse to the anode wire 1b. Therefore, the polarity of the capacitor is not visually recognizable, so that the capacitor may be errroneously mounted on the circuit board A' in reverse polarity. The capacitor thus erroneously mounted generates a lot of heat, consequently damaging the capacitor and its related components in a critical way.

The polarity of the capacitor may be rendered visually recognizable by forming a slot (not shown) at one of the leads 2, 3 and/or by forming a marking (not shown) on the upper face of the resin package 4 near one of the leads 2, 3. However, the slot of the lead is not readily recognizable due to its small size, whereas the marking of the package 4 is not recognizable from below the capacitor.

Similar problems are also encountered in other surface mounting type polar electronic components such as a diode.

SUMMARY OF THE INVENTION

It is, therefore, an object of the present invention to provide a surface mounting type polar electronic component, such as a solid electrolytic capacitor and a diode, which can be reliably prevented from being errroneously mounted and soldered to a circuit carrier with reverse polarity.

According to one aspect of the present invention, there is provided a surface mounting type polar electronic component comprising a polar element electrically connected to a positive lead and a negative lead, and a package enclosing the polar element together with part of the respective leads, the package having a mounting face, each of the leads having a contact end bent substantially in parallel to the mounting face of the package, wherein one of the leads has a projection extending beyond the contact end of said one lead.

Preferably, the projection forms one piece with said one lead. Further, it is also preferable that the projection and contact end of said one lead form two legs thereof initially arranged side by side, and one leg corresponding to the contact end is subsequently bent to be substantially perpendicular to the other leg corresponding to the projection.

The contact end of said each of the leads may be bent inwardly toward the mounting face of the package. Alternatively, the contact end of said each of the leads may be bent outwardly away from the mounting face of the package.

The polar element may be a solid electrolytic capacitor element or a diode element.

According to another aspect of the present invention, there is provided a combination of a surface mounting type polar electronic component and a circuit carrier; the component comprising a polar element electrically connected to a positive lead and a negative lead, and a package enclosing the polar element together with part of the respective leads, the package having a mounting face, each of the leads having a contact end bent substantially in parallel to the mounting face of the package; the circuit carrier being formed with a positive electrode pad and a negative electrode pad in corresponding relation to the respective leads of the component; wherein one of the leads has a projection extending beyond the contact end of said one lead; and wherein the circuit carrier is formed with an insertion hole for inserting the projection at one of the electrode pads corresponding to said one lead.

Other objects, features and advantages of the present invention will be fully understood from the following detailed description given with reference to the accompanying drawings.

DETAILED DESCRIPTION OF THE PREFERRED EMBODIMENTS

Figure 1:
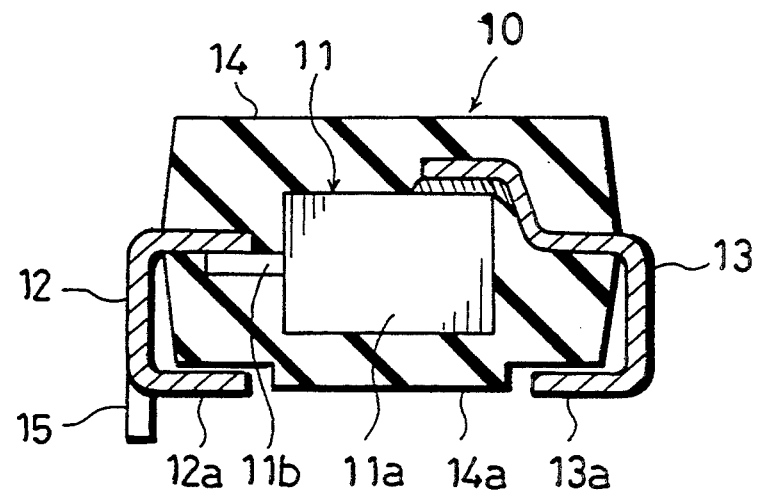
FIG. 1 is a sectional view showing a solid electrolytic capacitor embodying the present invention.
Figure 2:
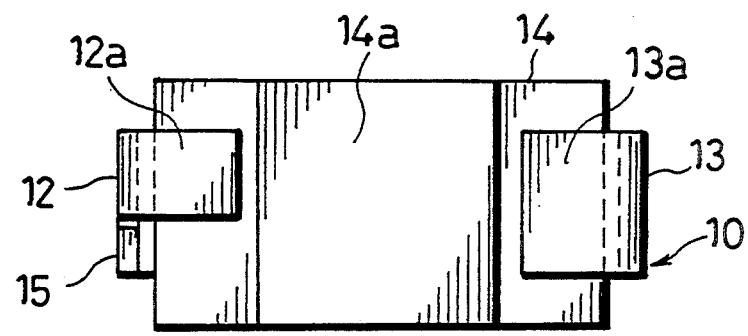
FIG. 2 is a bottom view showing the same capacitor.
Figure 3:
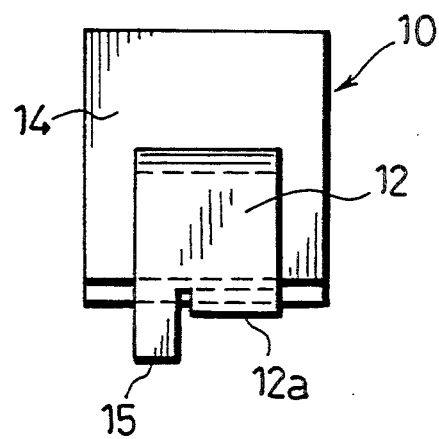
FIG. 3 is a side view showing the same capacitor.

FIGS. 1 to 4 of the accompanying drawings shows a first embodiment of the present invention wherein a solid electrolytic capacitor 10 is taken as an example of surface mounting type polar electronic component. The capacitor 10 may be a tantalum capacitor or an aluminum capacitor for example.

The capacitor 10 of the first embodiment comprises a capacitor element 11 which includes a chip 11a and an anode wire 11b projecting from the chip 11a. The chip 11a may be a compacted mass of tantalum powder for example, in which case the anode wire 11b is also made of tantalum.

The capacitor 10 also includes an anode lead 12 (positive lead) and a cathode lead 13 (negative lead), each of which is in the form of a metal plate. The anode lead 12 is electrically connected to the anode wire 11b by welding for example. The cathode lead 13 has an inner end electrically connected directly to the chip 11a by soldering or by using a conductive adhesive. Alternatively, the cathode lead 13 may be electrically connected to the chip 11a via an unillustrated safety fuse (not shown) which may be a temperature fuse or an overcurrent fuse for example.

The capacitor element 11 together with part of the respective leads 12, 13 are enclosed in a package 14 of a thermosetting resin (epoxy resin for example). The remaining portion of each of the respective leads 12, 13 is bent downwardly and inwardly toward the underside 14a of the resin package 14 to provide a contact end 12a, 3a which is substantially parallel to the package underside 14a.

According to the illustrated embodiment, the anode lead 12 has an integral projection 15 projecting beyond the contact end 12a by a suitable amount in a direction away from the underside 14a (mounting face) of the resin package 14. Alternatively, the cathode lead 13 may have a similar projection.

Figure 4:
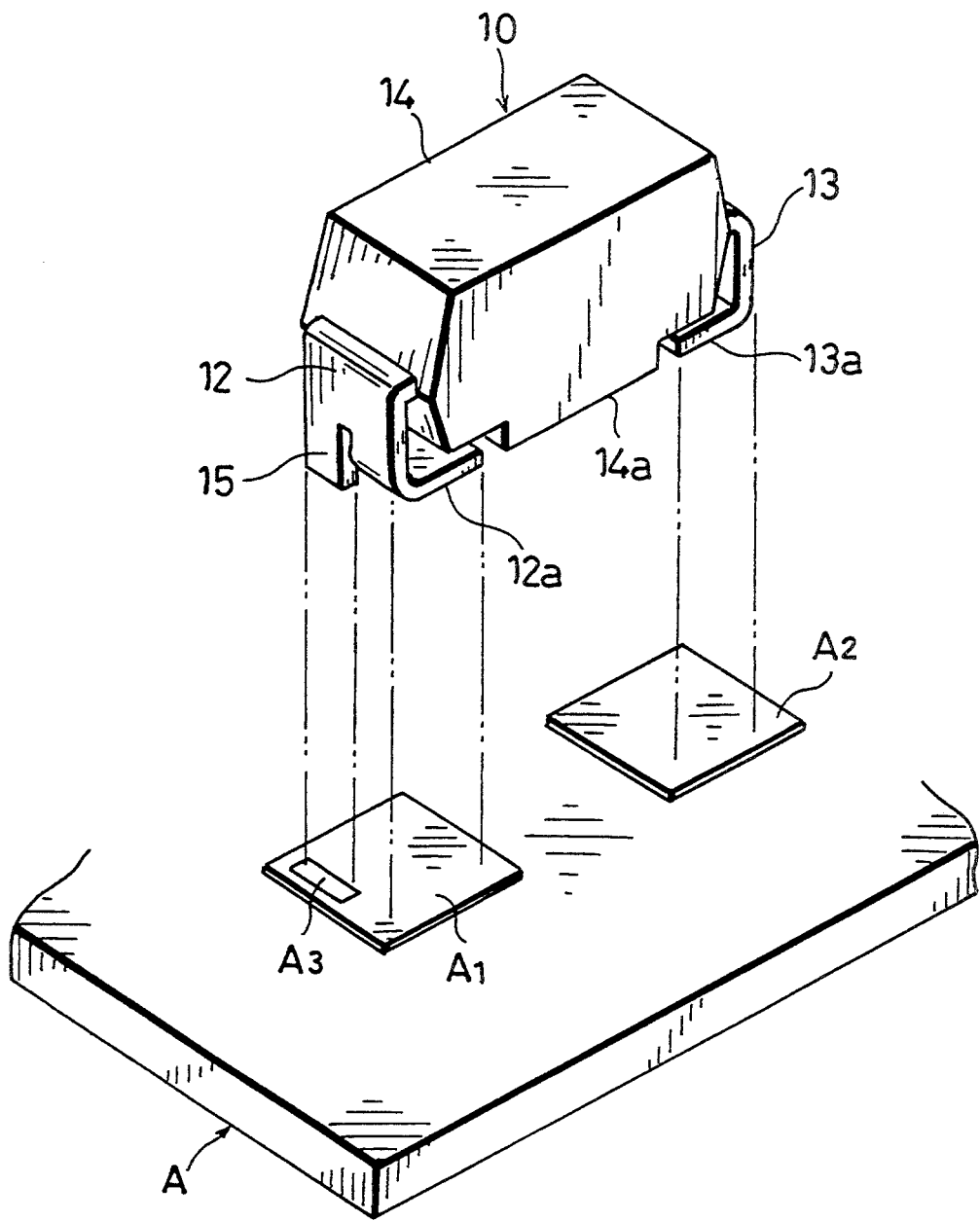
FIG. 4 is a perspective view showing the same capacitor together with a printed circuit board.

In use, the capacitor 10 may be mounted on a surface of a printed circuit board A (circuit carrier) which carries an anode-side electrode pad A1 and a cathode-side electrode pad A2, as shown in FIG. 4. The circuit board A is formed, only at the anode-side electrode pad A1, with an insertion hole or slot A3 complementary to the projection 15 of the anode lead 12.

When the capacitor 10 is mounted to the circuit board A with correct polarity relative to the respective electrode pads A1, A2, the projection 15 of the anode lead 12 fits in the insertion hole A3. Thus, the respective contact ends 12a, 13a of the anode and cathode leads 12, 13 can come into intimate contact with the corresponding pads A1, A2 for soldering thereto.

Conversely, when the capacitor 10 is mounted to the circuit board A with reverse polarity relative to the respective electrodes A1, A2, the projection 15 of the anode lead 12 comes into abutment with the cathode-side electrode pad A2 and fails to fit in the insertion hole A3. As a result, the contact end 12a of the anode lead 12 is lifted off the cathode-side electrode pad A2, or otherwise the capacitor 10 lies down. Therefore, it is impossible to mount the capacitor in reverse polarity by soldering.

As described above, it is possible to prevent the capacitor 10 from being erroneously mounted (soldered) in reverse polarity. The capacitor and the circuit incorporating it can be prevented from suffering faults and failures which would be caused by erroneous reverse-polarity mounting.

Figure 5:
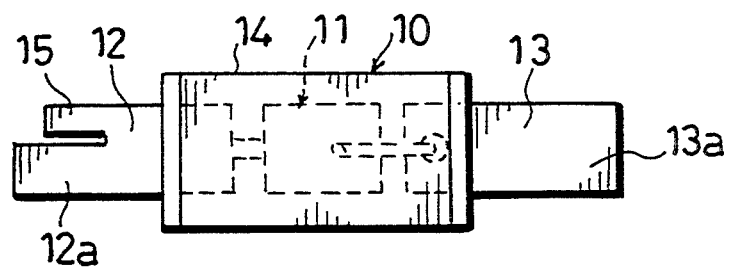
FIGS. 5 through 7 are views showing the successive steps of making the same capacitor.
Figure 6:
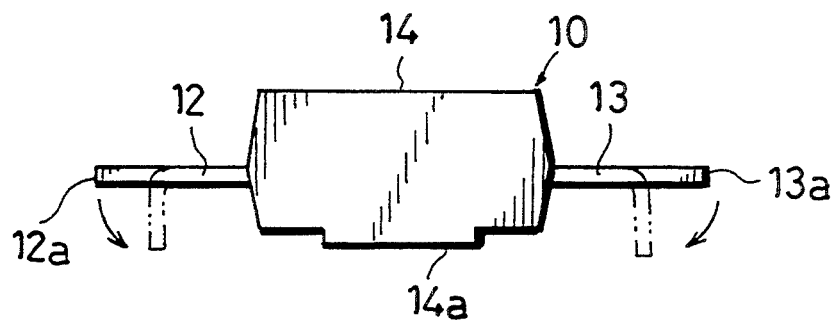

After molding the resin package 14, the respective portions of the anode and cathode leads 12, 13 projecting out of the resin package 14 are initially flat, as shown in FIGS. 5 and 6. In this state, the contact end 2a of the anode 12 may be regarded to form a longer leg, whereas the projection 15 of the anode may be considered to form a shorter leg arranged side by side with the longer leg 12a.

Figure 7:
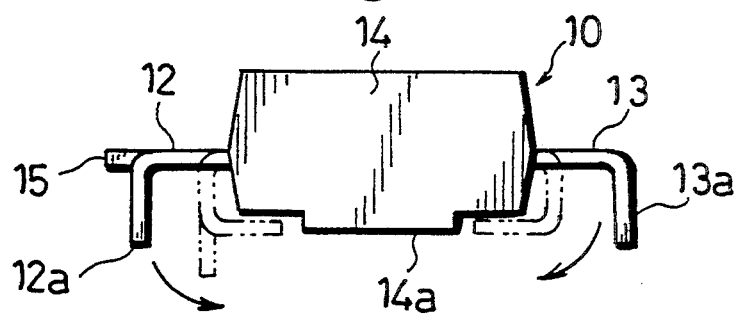

The contact ends 12a, 13a of the respective leads 12, 13 are first bent downward by an angle of about 90 degree with the projection 15 of the anode 12 left as is, as indicated by phantom lines in FIG. 6. Then, the projecting portions, as a whole, of the respective leads 12, 13 are bent downwardly inward by an angle of about 90 degrees to obtain a final product, as shown indicated by phantom lines in FIG. 7.

Figure 8:
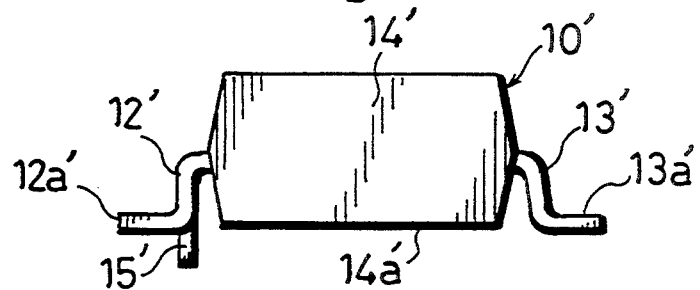
FIG. 8 is a front view showing another solid electrolytic capacitor embodying the present invention.

FIG. 8 shows a solid electrolytic capacitor 10' as a second embodiment of the present invention. Similarly to the first embodiment, the capacitor 10' of this embodiment comprises a resin package 14' from which an anode lead 12' and a cathode lead 13' project out, and the anode lead 12' has an integral projection 15'. However, according to the second embodiment, each of the respective leads 12', 13' has a contact end 12a', 13a' which is bent outwardly away from the underside 14a' of the package 14' substantially in parallel thereto.

Figure 9:
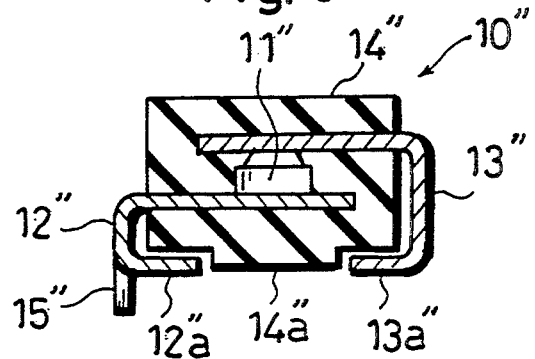
FIG. 9 is a sectional view showing a diode also embodying the present invention.
Figure 10:
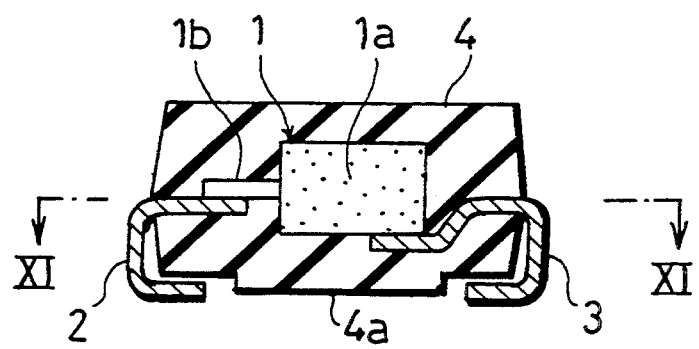
FIG. 10 is a sectional view showing a prior art solid electrolytic capacitor.
Figure 11:
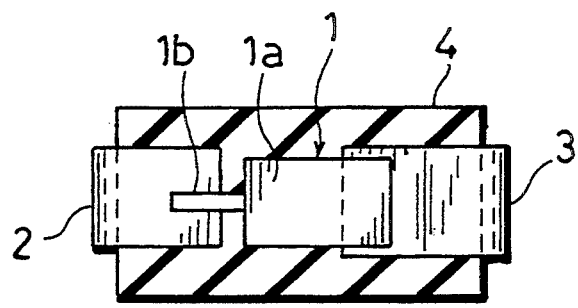
FIG. 11 is a sectional view taken along lines XI—XI in FIG. 10.
Figure 12:
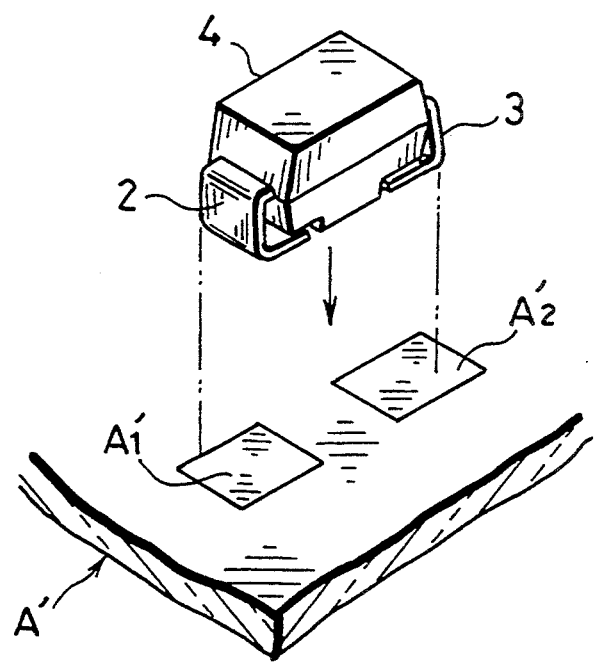
FIG. 12 is a perspective view showing the same prior art capacitor together with a printed circuit board.

FIG. 9 shows a third embodiment of the present invention wherein a diode 10" is taken up as an example of a polar electronic component. According to this embodiment, the diode 10" comprises a diode chip 11" interposed between a positive lead 12" and a negative lead 13", and a resin package 14" enclosing the diode chip 11" together with part of the respective leads 12", 13". The projecting portions of each of the respective leads 12", 13" are bent downwardly and inwardly toward the underside 14a" of the resin package 12" to provide a contact end 12a", 13a" which is substantially parallel to the package underside 14a". Further, the positive lead 12" has an integral projection 15" projecting beyond the contact end 12a" by a suitable amount in a direction away from the underside 14a" of the resin package 14".

Apparently, due to the presence of the projection 15", the diode 10" is reliably prevented from being erroneously mounted on a printed circuit board (not shown) with reverse polarity.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. A surface mounting type polar electronic component comprising a polar element electrically connected to a plate-like positive lead and a plate-like negative lead, and a package enclosing the polar element together part of the respective leads, the package having a mounting surface, each of the leads having a contact end bent substantially in parallel to the mounting face of the package, wherein one of the leads has a projection extending beyond the contact end of said one lead; and wherein the contact end of the other of the leads is entirely in parallel to the mounting face of the package.

2. The component according to claim 1, wherein the projection forms one piece with said one lead.

3. The component according to claim 2, wherein the projection and contact end of said one lead form two legs thereof initially arranged side by side, one leg corresponding to the contact end being bent to be substantially perpendicular to the other leg corresponding to the projection.

4. The component according to claim 3, wherein said one leg is longer than said other leg.

5. The component according to claim 1, wherein the contact end of said each of the leads is bent inwardly toward the mounting face of the package.

6. The component according to claim 1, wherein the contact end of said each of the leads is bent outwardly away from the mounting face of the package.

7. The component according to claim 1, wherein the polar element is a solid electrolytic capacitor element.

8. The component according to claim 1, wherein the polar element is a diode element.

9. A combination of a surface mounting type polar electronic component and a circuit carrier;

the component comprising a polar element electrically connected to a plate-like positive lead and a plate-like negative lead, and a package enclosing the polar element together part of the respective leads, the package having a mounting surface, each of the leads having a contact end bent substantially in parallel to the mounting face of the package;

the circuit carrier being formed with a positive electrode pad and a negative electrode pad in corresponding relation to the respective leads of the component;

wherein one of the leads has a projection extending beyond the contact end of said one lead;

wherein the contact end of the other of the leads is entirely in parallel to the mounting face of the package; and wherein the circuit carrier is formed with an insertion hole for inserting the projection at one of the electrode pads corresponding to said one lead.

10. A surface mounting type polar electronic component comprising a polar element electrically connected to only two plate-like leads, and a package enclosing the polar element together part of the respective leads, the package having a mounting surface, each of the leads having a contact end bent substantially in parallel to the mounting face of the package, wherein one of the leads has a projection extending beyond the contact end of said one lead;

wherein the other of the leads is non-identical in configuration to said one lead.

* * * * *